United States Patent
Tsutsui

[19]

[11] Patent Number: 6,081,066
[45] Date of Patent: Jun. 27, 2000

[54] PIEZO-ELECTRIC RESONATOR

[75] Inventor: Takashi Tsutsui, Shizuoka, Japan

[73] Assignee: NEC Corporation, Tokyo, Japan

[21] Appl. No.: 08/833,258

[22] Filed: Apr. 4, 1997

[30] Foreign Application Priority Data

Apr. 12, 1996 [JP] Japan .................................. 8-091462

[51] Int. Cl.⁷ .................................................. H01L 41/08
[52] U.S. Cl. .......................... 310/348; 310/367; 310/368; 310/354
[58] Field of Search .................................... 310/344, 345, 310/348, 368, 367, 312, 369, 321, 326, 354–356

[56] References Cited

U.S. PATENT DOCUMENTS

| | | | |
|---|---|---|---|
| 1,619,854 | 3/1927 | Crossley | 310/348 |
| 1,766,036 | 6/1930 | Crossley | 310/348 |
| 2,139,998 | 12/1938 | Clarke | 310/348 |
| 2,505,121 | 4/1950 | Knights | 310/368 |
| 2,626,363 | 1/1953 | Holmbeck | 310/367 |
| 4,649,310 | 3/1987 | Nakamura et al. | 310/321 |
| 4,716,332 | 12/1987 | Hayashi | 310/368 |

FOREIGN PATENT DOCUMENTS

| | | |
|---|---|---|
| 61-199313 | 9/1986 | Japan . |
| 3-182906 | 7/1988 | Japan . |
| 6-334472 | 12/1994 | Japan . |

*Primary Examiner*—Mark O. Budd
*Attorney, Agent, or Firm*—Young & Thompson

[57] ABSTRACT

A piezo-electric resonator includes terminal plates holding a piezo-electric substrate and which are stored in a case. The piezo-electric substrate can be formed from piezo-electric ceramics. The piezo-electric ceramic plate has projections at the non-vibrating sections of its cuter circumferential side surfaces. When the centers of the piezo-electric ceramic plate are held by the terminal plates, the projections do not contact the inner surfaces of the case. When the position of the piezo-electric ceramic plate is displaced due to external vibration, the projections may contact the inner surfaces of the case and the vibrating sections of the piezo-electric ceramic plate do not contact the inner surfaces of the case. Due to this fact, its electrical characteristics are not changed. in addition, since this configuration is set such that the piezo-electric ceramic plate can be slightly moved in the case, the piezo-electric ceramic plate is less likely to receive a high shock or stress through the case.

11 Claims, 3 Drawing Sheets

PRIOR ART      PRIOR ART

PIEZO-ELECTRIC RESONATOR

BACKGROUND OF THE INVENTION

1. Field of the Invention

This invention relates to a piezo-electric resonator installed in electronic equipment, for example, as a reference oscillator or a filter for a microcomputer.

2. Description of the Related Art

In the prior art, a piezo-electric resonator installed in electronic equipment has a fundamental configuration in which a piezo-electric substrate formed with electrodes at its two main planes is held by terminal boards. The terminal boards are formed with resilient projections and the projections are contacted with the piezo-electric substrate composed of a piezo-electric ceramic plate, for example. This piezo-electric ceramic plate and the terminal boards are stored a the case. In the gazette of Japanese Patent Laid-Open No. Sho 61-199313 is disclosed a system in which a plurality of projections are formed at an inner surface of the case. These projections hold non-vibrated sections at outer circumferential side surfaces of the piezo-electric ceramic plates so as to prevent the piezo-electric ceramic plates from being displaced from their set positions under an external application of vibration.

However, since the projections at inner surfaces of the case always contact with the outer circumferential side surfaces of the piezo-electric ceramic plates, a shrinkage of the case due to variation in temperature causes high stress to be applied to the piezo-electric ceramic ates. As a result, an electrical characteristic of the piezo-electric resonator is varied. In addition, when a high shock is applied to an external side to the case, there is a possibility that the piezo-electric ceramic plates may be damaged.

SUMMARY OF THE INVENTION

It is an object of the present invention to solve the aforesaid problem and to provide a piezo-electric resonator which is not influenced by a stress applied from an external side and a superior anti-shocking characteristic can be attained.

That is, the piezo-electric resonator of the present invention is formed with electrodes at its both surfaces and is provided with a piezo-electric substrate formed with projections at non-vibrating sections of the outer circumferential side surface. The projections of the terminal plates hold both sides of the piezo-electric substrates. In addition, the case stores these piezo-electric substrates and the terminal plates therein. The case can be sealed with resin. The aforesaid piezo-electric substrates can be formed with piezo-electric ceramics. The projections formed at the outer circumferential side surfaces of the piezo-electric ceramic plates can have a curved surface. Additionally, it is desirable that the case sections corresponding to the portions near the corners of the piezo-electric ceramic plate have concave portions.

The piezo-electric resonator of the present invention has some projections at the outer circumferential side surfaces of the piezo-electric ceramic plates acting as the piezo-electric substrates. In the case that the central portions of the aforesaid piezo-electric ceramic plate are held by the projections of the terminal plates, the projections are not contacted with the inner surfaces of the case. There is an occasion in which the piezo-electric ceramic plates are displaced from their set positions upon acceptance of external vibration and the projections are contacted with the inner surfaces of the case. However, the projections are formed at the non-vibrating sections of the piezo-electric ceramic plates and the vibrating sections (that is, corner sections) of the piezo-electric ceramic plates are not contacted with the inner surfaces of the case. Accordingly, an electrical characteristic of the ceramic resonator is not changed at all. In the piezo-electric resonator of the present invention, it is not constructed such that the piezo-electric ceramic plates are always held by the inner surfaces of the case. Due to this fact, the piezo-electric ceramic plates are not directly applied with a high shock or a high stress from the inner surfaces of the case, resulting in that they show a less possibility of damage and less variation in the characteristics of the resonator.

BRIEF DESCRIPTION OF THE DRAWINGS

The above and other objects, features and advantages of the present invention will become more apparent from the following detailed description when taken with the accompanying drawings in which.

DETAILED DESCRIPTION OF THE PREFERRED EMBODIMENTS

Figure 1:
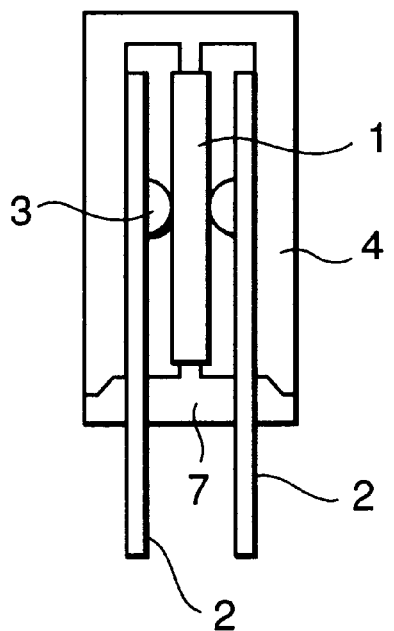
FIG. 1 is a side view of a piezo-electric ceramic plate of the prior art piezo-electric resonator.
Figure 2:
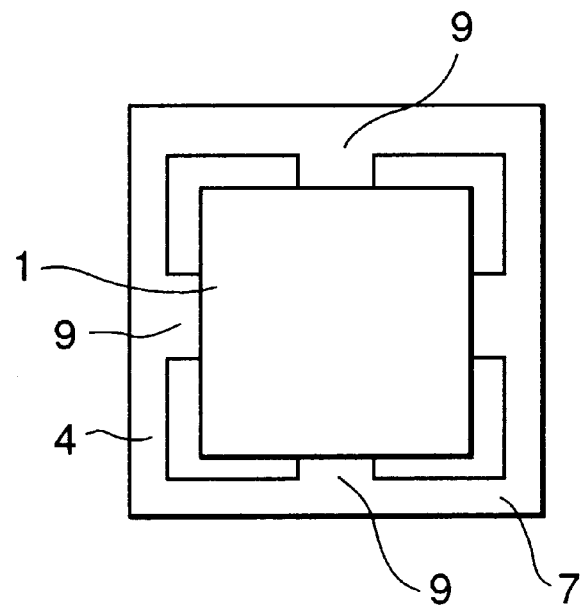
FIG. 2 is a plan view of with a piezo-electric ceramic plate of the prior art piezo-electric resonator.

In order to compare with the present invention at first, the prior art piezo-electric resonator will be described. Referring to FIGS. 1 and 2, a piezo-electric ceramic plate 1 having electrodes formed at both sides thereof is held by projections 3 formed at the terminal plates 2. This piezo-electric ceramic plate 1 and the terminal plates 2 are stored in the case 4. The piezo-electric ceramic plate 1 has a square shape and its non-vibrating sections at four sides are held by projections 9 formed at the inner surfaces of the case. However, as the case 4 is shrinks, there is a possibility that high stress is applied to the piezo-electric ceramic plate 1 to cause its electrical characteristics to changed. In addition, as a high shock is applied to the case 4 from an external source, there is also a possibility that the piezo-electric ceramic plate 1 is damaged.

Figure 3:
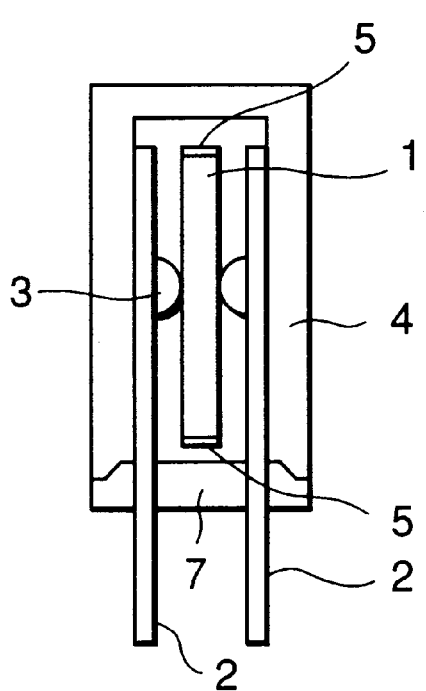
FIG. 3 is a sectional side view of to a piezo-electric ceramic plate showing an example of a configuration of the piezo-electric resonator of the present invention.
Figure 4:
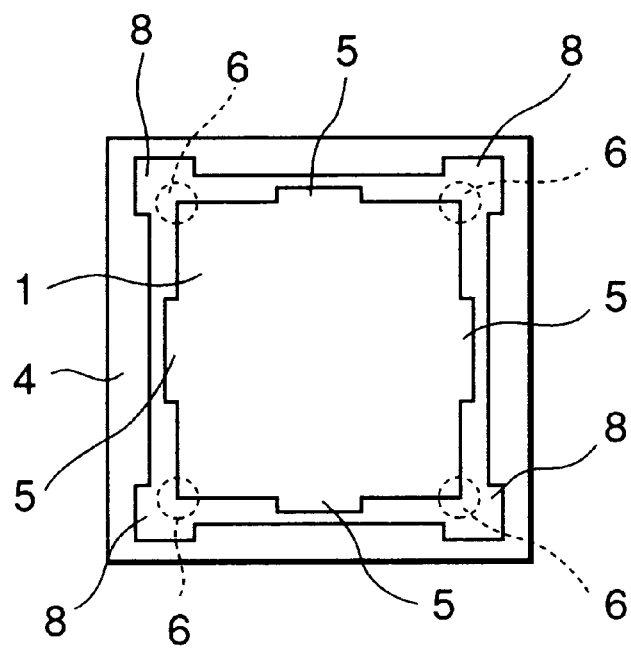
FIG. 4 is a plan view of a piezo-electric ceramic plate showing an example of a configuration of the piezo-electric resonator of the present invention.

FIGS. 3 to 6 illustrate an example of a configuration of the piezo-electric resonator of the present invention. Referring to FIG. 3, the projections 3 formed at the terminal plates 2 hold the central sections of the piezo-electric ceramic plate 1. The piezo-electric ceramic plate is square and has projections 5 near the non-vibrating parts of its four sides. The piezo-electric ceramic plate 1 and the terminal plates 2 are stored in the case 4. The case 4 is sealed with a resin plate 7. Referring to FIG. 4, it is apparent that when the central sections of the piezo-electric ceramic plate 1 are held by the projections 3 of the terminal plates 2, the projections 5 of the piezo-electric ceramic plate 1 are not contacted by the inner surfaces of the case 4. Concave sections 8 are formed at the inner surfaces of the case 4 placed at positions near the four corners of the vibrating points 6 of the piezo-electric ceramic plate 1. Vibrating points 6 of the piezo-electric ceramic plate 1 are not contacted with the inner surfaces of the case 4 due to the presence of the concave sections 8.

Figure 5:
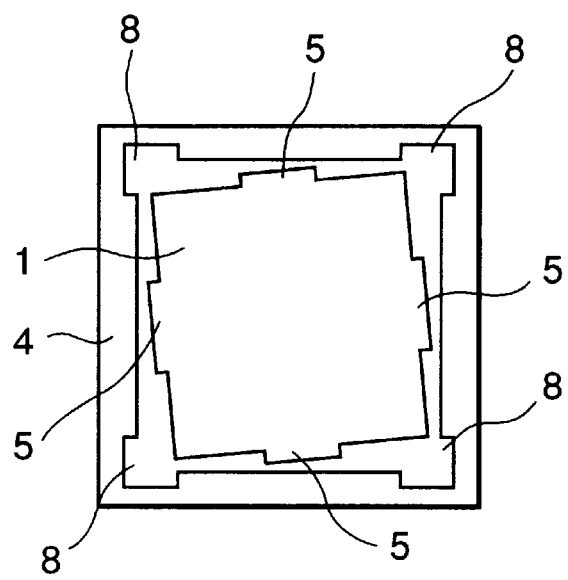
FIG. 5 is a plan view of a piezo-electric ceramic plate showing an example of a configuration of the piezo-electric resonator of the present invention.
Figure 6:
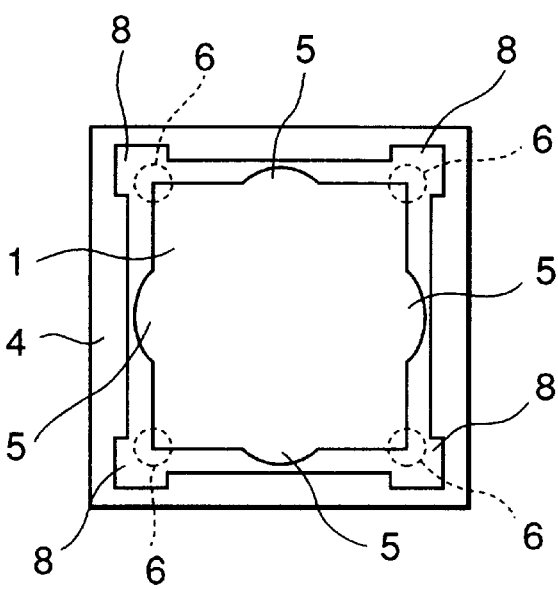
FIG. 6 is a plan view of a piezo-electric ceramic plate showing an example of a configuration of the piezo-electric resonator of the present invention and also indicating a case in which the projections are of a curved surface.

In the case that the piezo-electric ceramic plate 1 is displaced from its initial set position due to an external vibration, the projections 5 formed at the piezo-electric ceramic plate 1 are contacted by the inner sides of the case 4 and the piezo-electric ceramic plate 1 is not displaced more. In addition, the aforesaid projections 5 are formed at the non-vibrating sections of the piezo-electric ceramic plate 1, so that even if the projections 5 are contacted with the inner surfaces of the case 4, an electrical characteristic of the piezo-electric resonator is not changed. In addition, as shown in FIG. 5, the piezo-electric ceramic plate 1 may be rotated due to an external vibration. In this event, the case 4 is already formed with concave sections 8 and the piezo-electric ceramic plate 1 is formed with the aforesaid projections 5, so that the four vibrating sections (corners) of the piezo-electric ceramic plate 1 are not contacted by the inner surfaces of the case 4. In the case that the aforesaid projections 5 are contacted with the inner surfaces of the case 4 and the case 4 is shrinks, a certain stress is applied to the projections 5 of the piezo-electric ceramic plate 1 from the inner surfaces of the case 4. However, the piezo-electric ceramic plate 1 is pushed by the inner surfaces of the case 4 in response to shrinkage of the case 4 and can be moved. Due to this fact, no stress is given to the piezo-electric ceramic plate 1. Even if an external shock is applied to the case 4, the piezo-electric ceramic plate can be moved, so that no direct influence of shock is applied to the piezo-electric ceramic plate. The projections 5 of the piezo-electric ceramic plate 1 may be a rectangular shape or, as shown in FIG. 6, a curved surface. When the shape of the projections 5 is as shown in FIG. 6, it is possible to eliminate a possibility that the corners of the projections 5 are held by the inner surfaces of the case 4, and the piezo-electric ceramic plate is not moved or hardly moved.

The piezo-electric resonator of the present invention can be manufactured as follows. The case 4 made of resin having an outer shape with one side size being 6 to 7 mm is prepared. A size of the inner part of the case 4 as viewed from its top plan view is set to have such a value as one in which when the piezo-electric ceramic plate 1 with one side size of 5 mm is mounted, a space between the inner surface of the case and the piezo-electric ceramic plate becomes about 0.1 mm to 0.2 mm. In addition, the portions at the inner surfaces of the case 4 corresponding to the four corners of the piezo-electric ceramic plate are formed with concave sections. A size of the inner part of the case 4 is determined in such a way that the resilient projections 3 of the terminal plate 2 can hold the piezo-electric ceramic plate 1 with a predetermined force. The projections 3 of the terminal plate 2 can be formed into a semi-spherical shape by a pressing work, for example.

The terminal plate 2 made of phosphor bronze or the like, for example, is inserted into the case 4 in such a way that its semi-spherical projections 3 may be directed toward inside the case 4. A size of the terminal plate 2 is set to be substantially equal to a size of the inner surface of the case 4 in such a way that the terminal plate may not easily be moved in it. A shape of the piezo-electric ceramic plate 1 is square with the thickness of the piezo-electric ceramic plate 1 being about 0.5 to 1.0 mm and with its one side having a length of about 5 mm. At both main surfaces of the piezo-electric ceramic plate 1 are formed electrodes whose sizes are slightly smaller than its outer shape. At the central sections of the four sides of the piezo-electric ceramic plate are formed projections 5 having a height of about 0.1 mm to 0.15 mm. The projections 5 can be formed by grinding an outer circumference of the sintered piezo-electric ceramic plate. In place of the piezo-electric ceramic plate 1, a piezo-electric single-crystal material such as crystal can be applied. In this case, the projections 5 formed at an outer circumferential part are formed by an etching process or the like.

Next, the terminal plate 2 having the same shape as that of the aforesaid terminal plate 2 is placed on the piezo-electric ceramic plate 1 with its orientation being oppositely set. After this operation, a position of the piezo-electric ceramic plate 1 is adjusted. Then, the opening part of the case 4 is covered by the resin plate 7 in such a way that a part of the terminal plate may be projected outside the case 4 and then the case 4 is sealed with resin.

A width and a height of the projections 5 formed at four sides of the piezo-electric ceramic plate 1 and a size of the concave sections arranged at the four corners of the inner surface of the case are determined in response to a size of the piezo-electric ceramic plate 1 and a size of the inner part of the case 4. However, in case the piezo-electric ceramic plate 1 is rotated, at first, the size of the projections 5 and the size of the concave part of the case 4 are determined in such a way that the projections 5 may be contacted with the inner surfaces of the case.

With the foregoing, the piezo-electric resonator of the present invention is constructed such that when the piezo-electric ceramic plate is displaced in its position and the projections arranged at the non-vibrating sections of the outer circumferential part are contacted with the inner surfaces of the case, and the vibrated sections are not contacted with the inner surfaces of the case. Due to this fact, an electrical characteristic of the piezo-electric resonator is not changed. In addition, since the piezo-electric ceramic plate can be moved slightly within the case, the plate may be hardly influenced by stress or external shock through the case.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A piezo-electric resonator comprising:
    a parallelepipedal piezo-electric substrate having electrodes at two main surfaces thereof and projections at non-vibrating middle sections of peripheral sides of said substrate between vibrating corners;
    terminal plates for supporting two main surfaces of said piezo-electric substrate; and
    a case for storing said piezo-electric substrate and said terminal plates,
    wherein said case has corresponding interior corners which are recessed relative to interior sides of said case between said corresponding interior corners, said interior sides of said case not contacting the peripheral sides of said substrate in a normal alignment of said substrate within said case, and wherein said projections extend outwardly a distance so that said projections contact said interior sides of said case before the non-vibrating middle sections of said substrate contact said interior sides of said case when said substrate is turned in said case.

2. A piezo-electric resonator as set forth in claim 1, wherein said piezo-electric substrate is a piezo-electric ceramic plate.

3. A piezo-electric resonator as set forth in claim 1, wherein the projections are spaced apart from the inner surfaces of said case when the main surfaces of said piezo-electric substrate are supported by said terminal plates.

4. A piezo-electric resonator as set forth in claim 1, wherein each of the projections of said piezo-electric substrate is arcuate throughout its peripheral length.

5. A piezo-electric resonator as set forth in claim 1, wherein said terminal plates have projections with curved surfaces and said curved surfaces are abutted against said piezo-electric substrate.

6. A piezo-electric resonator as set forth in claim 1, wherein said case is sealed with resin.

7. A piezo-electric resonator comprising:

a parallelepipedal piezo-electric substrate with vibrating corners, said substrate comprising electrodes on two main opposing surfaces and four projections, each of said four projections projecting from a non-vibrating middle portion of a different one of four peripheral sides of said substrate;

a case containing said substrate, said case having parallelepiped-forming inner walls with four interior corners, each of said four interior corners being recessed relative to said inner walls; and two terminal plates extending into said case, each of said terminal plates having a protruding contact pressing on a central portion of a different one of said electrodes and supporting said substrate within said case so that said peripheral sides of said substrate are spaced from and parallel to respective adjacent ones of said inner walls of said case and said projections are spaced from respective adjacent ones of said inner walls when said substrate is supported within said case in a primary position, said case and said substrate being constructed and sized so that said projections contact said inner walls, preventing said vibrating corners from contacting said inner walls and said interior corners of said case, when said substrate is rotated from the primary position.

8. The resonator of claim 7, wherein each of said projections extends no more than about one-third a length of its respective peripheral side.

9. The resonator of claim 8, wherein said projections are mesas.

10. The resonator of claim 8, wherein each of said projections is arcuate throughout its peripheral length.

11. The resonator of claim 1, wherein each of said projections extends no more than about one-third a length of its respective peripheral side.

* * * * *